United States Patent
Chen (10) Patent No.: US 10,888,022 B2
(45) Date of Patent: Jan. 5, 2021

(54) FAN SPEED CONTROL IN ELECTRONIC DEVICES

(71) Applicant: Hewlett-Packard Development Company, L.P., Houston, TX (US)

(72) Inventor: Fu-Yi Chen, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 9 days.

(21) Appl. No.: 16/066,409

(22) PCT Filed: Mar. 29, 2016

(86) PCT No.: PCT/US2016/024608
§ 371 (c)(1),
(2) Date: Jun. 27, 2018

(87) PCT Pub. No.: WO2017/171721
PCT Pub. Date: Oct. 5, 2017

(65) Prior Publication Data
US 2019/0008074 A1 Jan. 3, 2019

(51) Int. Cl.
H05K 7/20 (2006.01)
F04D 27/00 (2006.01)
G06F 1/20 (2006.01)
G05D 23/19 (2006.01)

(52) U.S. Cl.
CPC ....... *H05K 7/20209* (2013.01); *F04D 27/004* (2013.01); *G05D 23/1917* (2013.01); *G05D 23/1919* (2013.01); *G06F 1/20* (2013.01); *G06F 1/206* (2013.01)

(58) Field of Classification Search
USPC ......................................................... 700/86
See application file for complete search history.

(56) References Cited

U.S. PATENT DOCUMENTS

| | | |
|---|---|---|
| 6,029,119 A | 2/2000 | Atkinson |
| 6,591,198 B1 | 7/2003 | Pratt |
| 7,941,231 B1 | 5/2011 | Dunn |
| 2009/0002939 A1 | 1/2009 | Baugh et al. |
| 2009/0222147 A1 | 9/2009 | Nakashima et al. |
| 2010/0214739 A1 | 8/2010 | Guan |
| 2010/0296945 A1* | 11/2010 | Nitta ................. G06F 1/206 417/2 |

(Continued)

FOREIGN PATENT DOCUMENTS

JP 2004252531 A 9/2004

OTHER PUBLICATIONS

Smutz, Charles. "Appeasing the Volcano: Slowing Down the TT Volcano 12", Jul. 10, 2004, 3 pages, Available at: http://www.overclockers.com/appeasing-the-volcano-slowing-down-the-tt-volcano-12/.

*Primary Examiner* — Mohammad Ali
*Assistant Examiner* — Joshua T Sanders
(74) *Attorney, Agent, or Firm* — Global IP Services PLLC (57) ABSTRACT

In one example, an electronic device is described, which includes a cooling element and a controller coupled to the cooling element. The controller may detect environmental data and system operating data of the electronic device during a period of time, obtain a user input associated with an acceptable noise level for the cooling element, and control the cooling element based on the environmental data, the system operating data, and the acceptable noise level of the cooling element.

17 Claims, 8 Drawing Sheets

(56) References Cited

U.S. PATENT DOCUMENTS

| | | | | |
|---|---|---|---|---|
| 2012/0253490 | A1* | 10/2012 | Su | G05D 23/19 700/94 |
| 2013/0289792 | A1 | 10/2013 | Cheng et al. | |
| 2015/0098180 | A1 | 4/2015 | Berghe | |

* cited by examiner

| NSS 402 (HIGHER IS BETTER) | PERCEPTION 404 |
|---|---|
| 1 | NOT ACCEPTABLE, EXTREMELY ANNOYING |
| 2 | PERCEPTIBLE AND VERY ANNOYING |
| 3 | PERCEPTIBLE AND SLIGHTLY ANNOYING |
| 4 | BARELY PERCEPTIBLE, NOT ANNOYING |
| 5 | NOT PERCEPTIBLE |

000
FAN SPEED CONTROL IN ELECTRONIC DEVICES

BACKGROUND

Computers and other electronic devices contain numerous electronic components such as processors, memory and graphics products, and other integrated circuits (ICs) that may generate heat. Electronic components can be heat-sensitive. Heat may cause malfunction or physical damage to the electronic components. Cooling elements such as fans, may be used to cool the electronic components. For example, cooling fans may direct air over hotter surfaces to dissipate heat from the electronic devices.

BRIEF DESCRIPTION OF THE DRAWINGS

Examples are described in the following detailed description and in reference to the drawings, in which.

DETAILED DESCRIPTION

Cooling systems in electronic devices, such as desktop computers, may implement temperature control schemes that focus on either maximizing the cooling capacity of the system by increasing fan speed and air flow or by reducing the amount of heat generated by limiting the performance of the computer (e.g., regulate the processors speed to reduce heat generation). Further, a fan speed can be controlled to operate at varying speeds. Users may have different usage level (e.g., light, middle, or heavy loading) and sensitivity for fan noise. For example, a user's usage of an electronic device may be at middle loading but they may not endure the middle level noise.

Examples described herein may describe an electronic device including a cooling element (e.g., fan) and a controller coupled to the cooling element. The controller may detect/receive environmental data and system operating data of the electronic device for a period of time, obtain a user input associated with an acceptable noise level for the cooling element, and control the cooling element (e.g., fan speed) based on the environmental data, the system operating data, and the acceptable noise level of the cooling element. In one example, the system operating data may include activity level of the component, power dissipation of the component, temperature of the component, fan speed, or a combination thereof. The component may be selected from the group consisting of a processor, graphic card, memory, and hard disk drive. The environmental data may include an internal and external environment ambient temperature of the electronic device.

In one example, a usage model of the electronic device may be determined by analyzing the environmental data and the system operating data associated with the period of time. For example, the usage model may include a light load, a medium load, and/or a heavy load. Further, a user may be allowed to input a noise satisfaction score (i.e., the acceptable noise level) associated with the fan. The noise satisfaction score may be selected from a range of values, with each value corresponding to a different noise perception level. Further, a fan speed control may be determined based on the usage model and the noise satisfaction score. The determined fan speed control may be recommended to control the fan speed of the electronic device. The fan speed of the electronic device may be controlled based on the recommended fan speed control, for example, to improve end-user experience.

The electronic device may further include a microphone to detect an ambient noise surrounding the electronic device and speaker volume associated with the electronic device. When a user selects an operating mode (e.g., speaker quality mode) of the electronic device, the controller may control the cooling element based on the ambient noise and the speaker volume to improve the speaker audio quality.

As described below, examples described herein may provide a customized fan speed control based on end-user input information. Further, the examples described herein may provide a quiet end-user experience by maintaining thermal reliability. Examples described herein may allow end-user to select a default fan speed control mode or a speaker audio quality mode. Examples described herein may detect environment background noise by internal microphone to determine the speaker volume profile. Examples described herein may provide improved speaker acoustic quality which may consider the fan speed noise.

Figure 1:
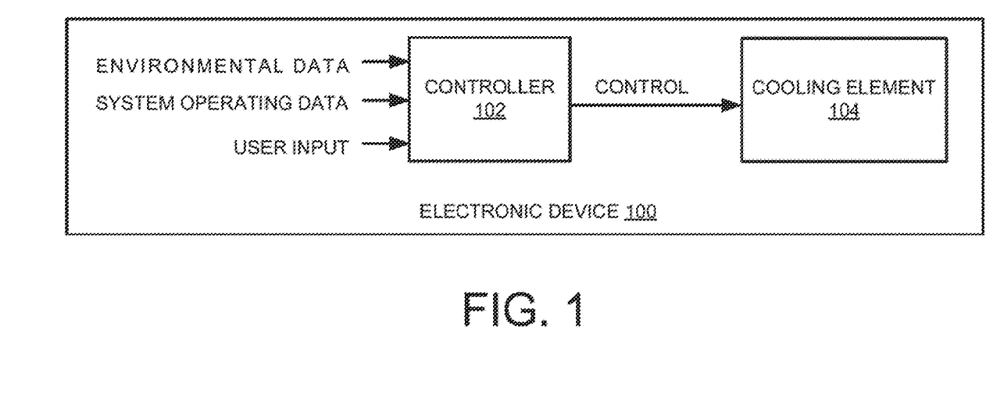
FIG. 1 is a block diagram of an example electronic device including a controller to control a cooling element in the electronic device.

Turning now to the figures, FIG. 1 is a block diagram of an example electronic device 100 including a controller 102 to control a cooling element 104 in electronic device 100. Example electronic device may include, but not limited to, a desktop computer, portable personal computer, or all-in-one personal computer. Further, electronic device 100 may include cooling element 104 and controller 102 coupled to cooling element 104. For example, cooling element 104, such as a fan, may be used to cool electronic components in electronic device 100. Controller 102 may be implemented as engine or module comprising any combination of hardware and programming to implement the functionalities described herein. In another example, controller 102 may be implemented in a processor of electronic device 100 and may include hardware and/or software components.

During operation, controller 102 may detect environmental data and system operating data of electronic device 100 during a period of time. Example environmental data may include internal and external environment ambient temperature of electronic device 100. Electronic device 100 may be equipped with sensors to collect various environmental data and system operation data. For example, sensors may be used to detect the internal and external environment ambient temperature of electronic device 100. Internal environment ambient temperature may refer to ambient temperature inside the electronic device and external environment ambient temperature may refer to the ambient temperature in the external vicinity of electronic device 100.

Example system operating data may include activity level of a component in the electronic device 100, power dissipation of the component, temperature of the component, fan speed, or a combination thereof. For example, sensors may be used to detect the temperature of the components. The component may be selected from the group consisting of a processor, a graphic card, memory, battery, and a hard disk drive. This is explained in FIGS. 2 and 3.

Figure 2:
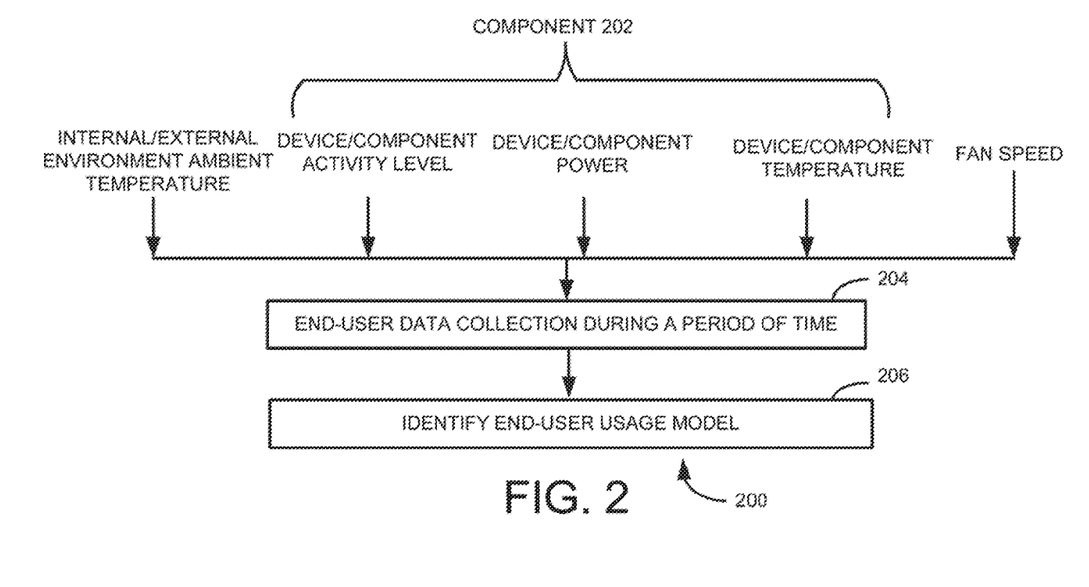
FIG. 2 is an example schematic illustrating environmental data and system operating data collection to identify a usage model associated with the electronic device.

FIG. 2 is an example schematic 200 illustrating environmental data and system operating data collection to identify a usage model associated with the electronic device. At 204, controller 102 may collect end-user data during a period of time. End-user data, collected by controller 102, may be an indicative of the user's usage pattern and the associated performance level of electronic device 100. The end-user data may include environmental data and the system operating data. Example environmental data may include internal and external environment ambient temperature of electronic device 100. Example system operating data may include activity level of a component 202, power dissipation of component 202, temperature of component 202, fan speed, or a combination thereof. Component 202 may include component/device such as a processor (e.g., central processing unit (CPU)), a graphic card, memory, or a hard disk drive (HDD).

Figure 3A:
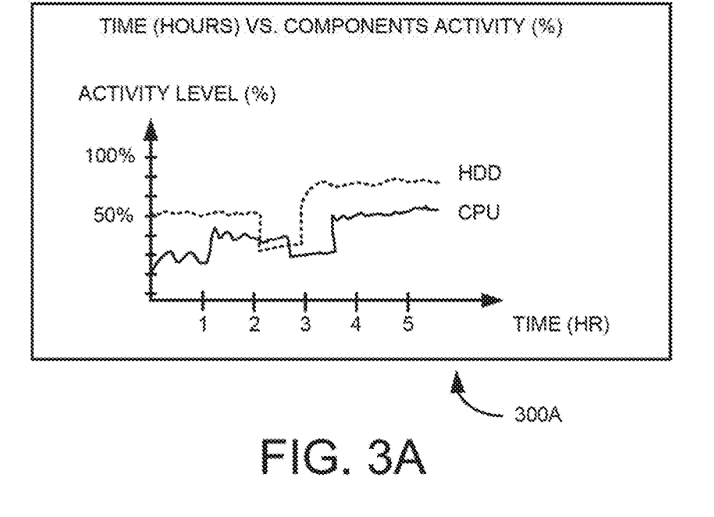
FIGS. 3A-3C depict example graphs Illustrating system operating data collection during a period of time.
Figure 3B:
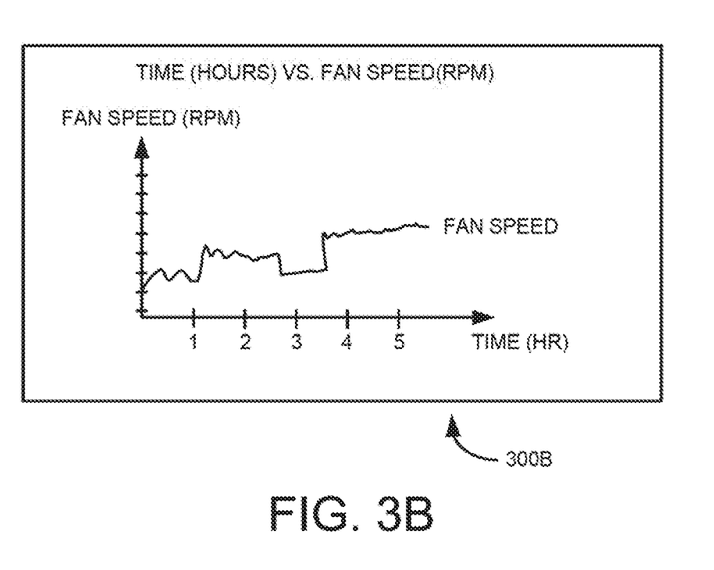
Figure 3C:
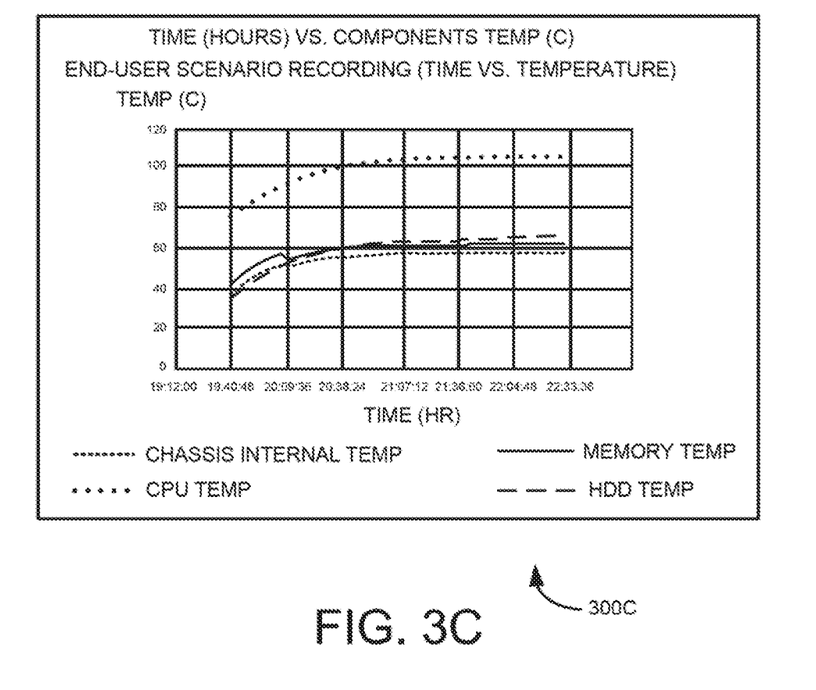

FIGS. 3A-3C depict example graphs illustrating system operating data collection during a period of time. For example, FIG. 3A depicts a graph 300A illustrating activity level of components (e.g., HDD and CPU) collected during the period of time. FIG. 3B depicts a graph 300B illustrating fan speed collected over the period of time. FIG. 3C depicts a graph 300C illustrating internal temperature of the electronic device (i.e., chassis temperature), temperature of the components such as CPU, memory, and HDD collected over the period of time.

Referring back to FIG. 2, at 206, the environmental data and the system operating data may be analyzed to identify the usage model of the electronic device during the period of time. For example, the usage model comprises a light load, a medium load, a heavy load, or a combination thereof. The term load may be a measure of the amount of computational work that the electronic device or the component performs over the period of time.

Figure 4:
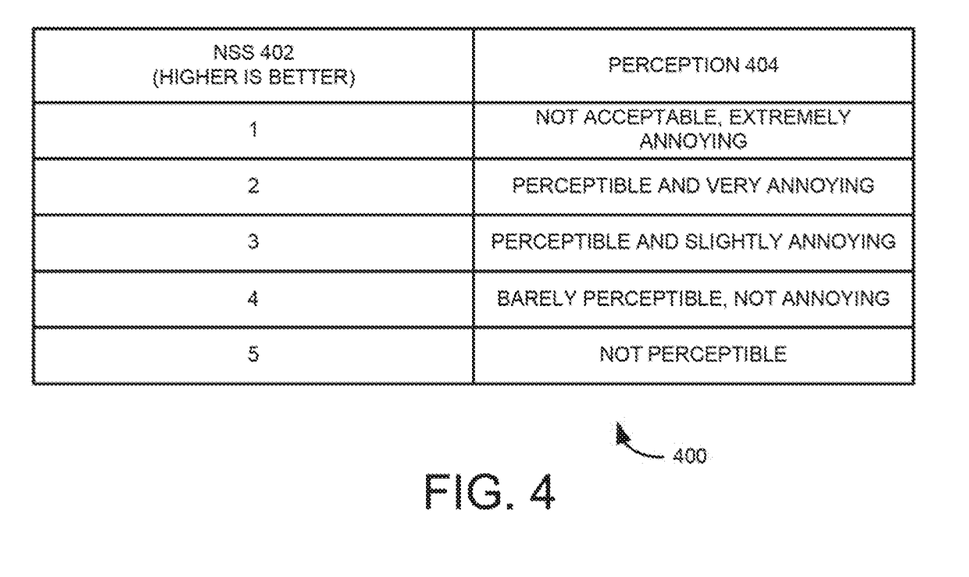
FIG. 4 is an example table depicting noise, satisfaction scores and associated noise perception levels.

Referring back to FIG. 1, controller 102 may obtain a user input associated with an acceptable noise level for cooling element 104. This is explained in FIG. 4, which is an example table 400 depicting noise satisfaction scores (NSS) 402 and associated noise perception levels 404. The user may input the noise satisfaction score via a user interface of electronic device 100. For example, the noise satisfaction score "1" may be associated with a perception level "not acceptable and extremely annoying", the noise satisfaction score "2" may be associated with a perception level "perceptible and very annoying", the noise satisfaction score "3" may be associated with a perception level "perceptible and slightly annoying", the noise satisfaction score "4" may be associated with a perception level "barely perceptible, not annoying" and the noise satisfaction score "5" may be associated with a perception level "not perceptible". Even though FIG. 4 may be described using noise satisfaction scores as inputs, other types of inputs, such as a generalized description of the noise characteristics for the fan, can also be obtained from the user.

Referring back to FIG. 1, controller 102 may control cooling element 104 based on the environmental data, the system operating data, and the acceptable noise level of the cooling element. For example, controller 102 may control a speed of the fan based on the determined usage model and the acceptable noise level. For example, controller 102 may generate a control signal based on the usage model and the inputted acceptable noise level and may convey the control signal to the fan for modifying a speed of the fan. Controlling the fan speed may be explained in detail using FIG. 5.

Figure 5:
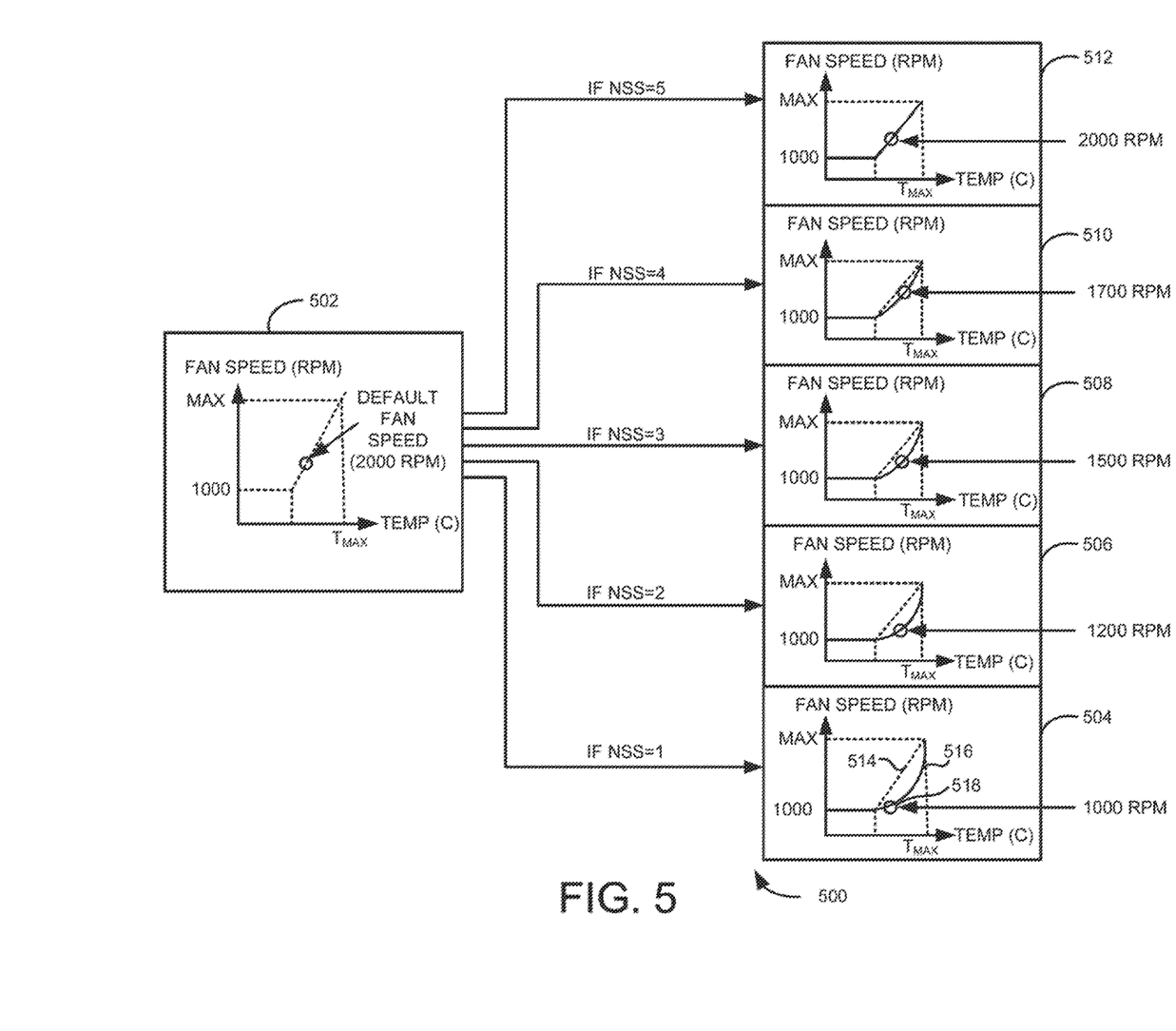
FIG. 5 illustrates an example graphical representation depicting a modified fan speed control corresponding to each of the noise satisfaction scores.

FIG. 5 illustrates an example graphical representation 500 depicting a modified fan speed control corresponding to each of the noise satisfaction scores. Example graph 502 may depict default fan speed (e.g., 2000 revolutions per minute (rpm)) during the end-user data collection in the period of time (e.g., 1 week). Example graph 504 may depict a default temperature versus fan speed curve 514 and a modified temperature versus fan speed curve 516 based on the usage model/profile. Further, graph 504 may depict a modified fan speed 518 (e.g., 1000 rpm) when the user inputs a noise satisfaction score of 1. Similarly, graphs 506, 508, and 510 may depict a modified fan speed (e.g., 1200 rpm) when the user inputs a noise satisfaction score of 2, modified fan speed (e.g., 1500 rpm) when the user inputs a noise satisfaction score of 3, and modified fan speed (e.g., 1700 rpm) when the user inputs a noise satisfaction score of 4. If the user inputs maximum noise satisfaction score, i.e., 5, the fan speed may not be changed as shown in graph 512. In another example, fan speed can be kept at maximum speed when the components generate temperature ($T_{max}$) above a threshold, to ensure system thermal reliability.

Figure 6A:
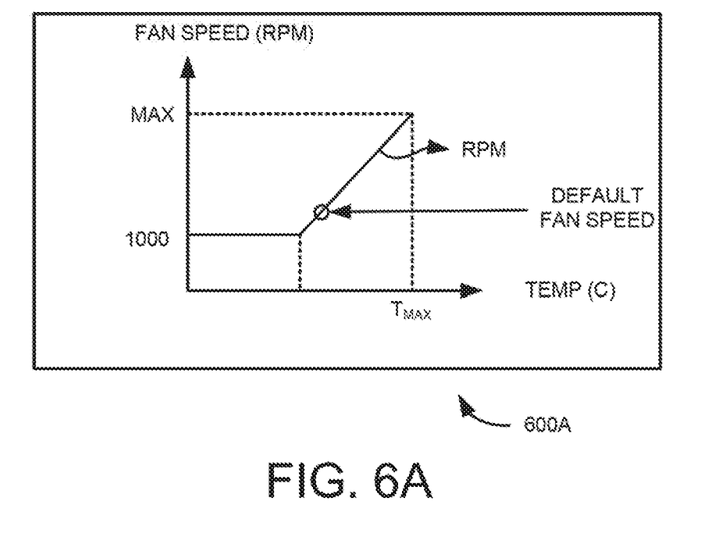
FIGS. 6A and 6B depict example graphs illustrating comparison between a default fan speed and the modified fan speed, respectively.
Figure 6B:
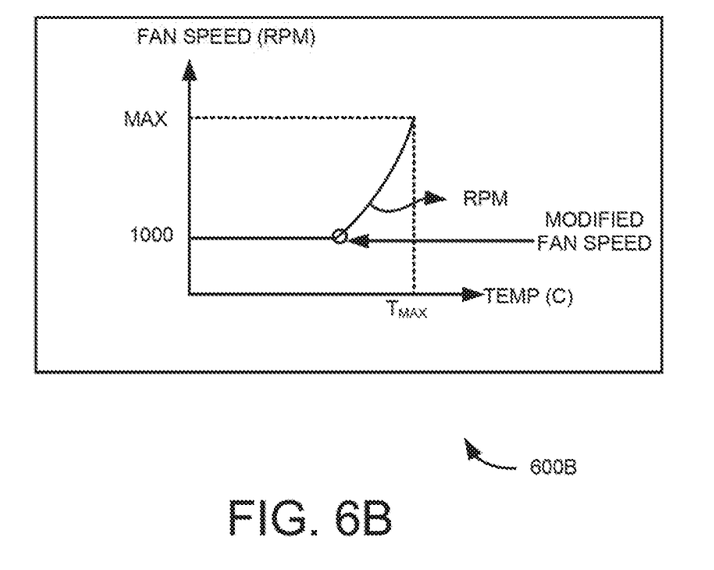

FIGS. 6A and 6B depict example graphs 600A and 600B illustrating comparison between a default fan speed and the modified fan speed, respectively. Particularly, graph 600A may illustrate default fan speed (e.g., 2000 rpm) during end-user data collection in a period of time and graph 600B depicts a modified fan speed (e.g., 1000 rpm) based on the end-user usage model and the noise satisfaction score.

Figure 7:
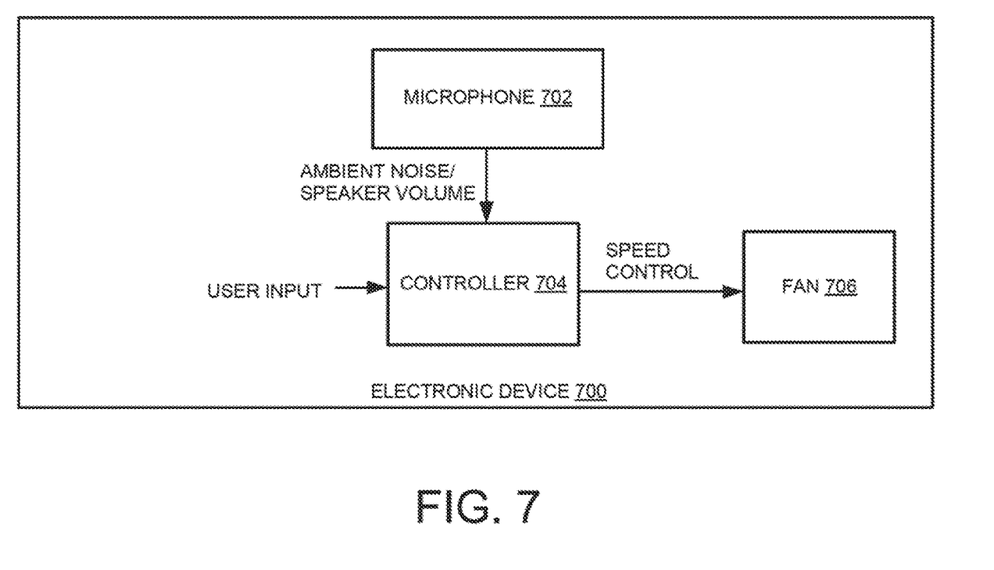
FIG. 7 is a block diagram of the example electronic device illustrating additional components to control the fan speed in the electronic device.
Figure 8:
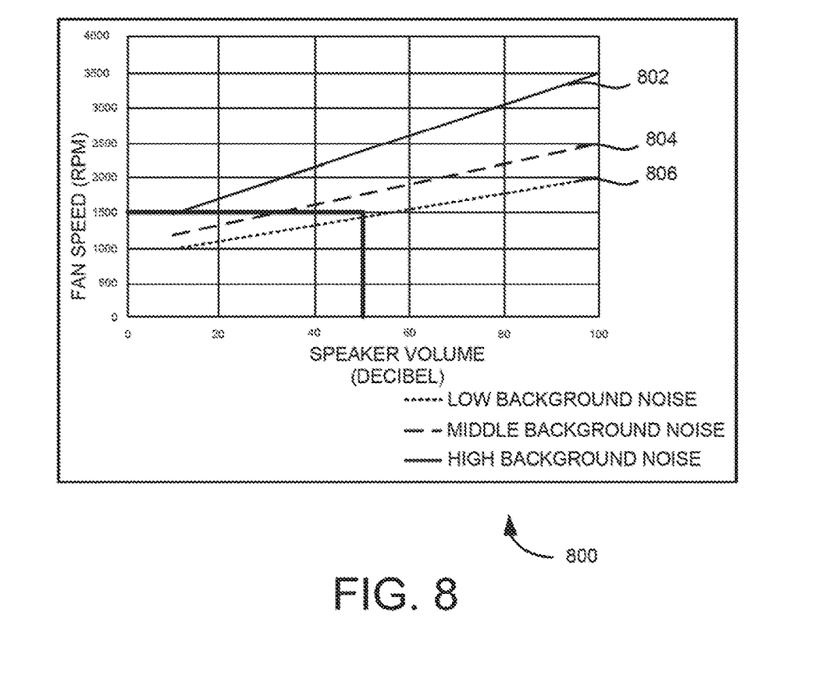
FIG. 8 depicts an example graph illustrating different speaker volume profiles corresponding to the environment background noise.

In another example, speaker volume can be used as one of the inputs to control the fan speed, which is explained in FIGS. 7 and 8. FIG. 7 is a block diagram of the example electronic device 700 illustrating components to control the fan speed in electronic device 700. Electronic device 700 may include a microphone 702, fan 706, and controller 704 coupled to microphone 702 and fan 706. Microphone 702 may be inbuilt in electronic device 700 or external to electronic device 700 and communicatively connected to electronic device 700. During operation, microphone 702 may detect an ambient noise surrounding electronic device 700, for instance, before switching on the speaker (e.g., before playing music). For example, microphone 702 may receive acoustic energy impinging upon the electronic device 700. Further, microphone 702 may detect speaker volume associated with electronic device 700, for instance, after switching on the speaker. Controller 704 may provide an interface to enable a user to select an operating mode (e.g., speaker quality mode) of electronic device 700. Controller 704 may control speed of fan 706 based on the ambient noise and the speaker volume for improving the speaker acoustic quality when the user selects the speaker quality mode.

In one example, controller 704 may include two fan speed control modes, for example, in embedded controller (EC)

firmware. Example fan speed control modes may include default a fan speed control mode (e.g., temperature versus fan speed) and a speaker quality mode (e.g., speaker volume versus fan speed). When the speaker quality mode is selected, the internal microphone may detect the environment background noise, and controller 704 may determine speaker volume profile (e.g., fan speed versus speaker volume) to control the fan speed. Example speaker volume profile for speaker quality mode associated with the detected environment background noise may include low volume, middle volume, and high volume. Controller 704 may override default fan speed control profile with speaker volume profile to adjust the speed of the fan depending on the amount of background noise and the speaker volume profile. This is explained in FIG. 8.

FIG. 8 depicts an example graph 800 illustrating different speaker volume profiles corresponding to the environment background noise. Particularly, FIG. 8 may depict speaker volume profiles for high background noise 802, intermediate/middle background noise 804 and low background noise 806. In one example, when electronic device is in loud background noise environment (e.g., pub), the fan speed limitation can be below high background noise profile 802. In another example, when the electronic device is in quiet background environment (e.g., bedroom), the fan speed limitation can be below the low background noise profile 806. when user selects audio quality mode, the speaker volume profile may override the temperature profile. In the example shown in FIG. 8, graph 800 depicts a modified fan speed (e.g., 1500 rpm) based on the background noise and the speaker volume when the user selects audio quality mode.

Figure 9:
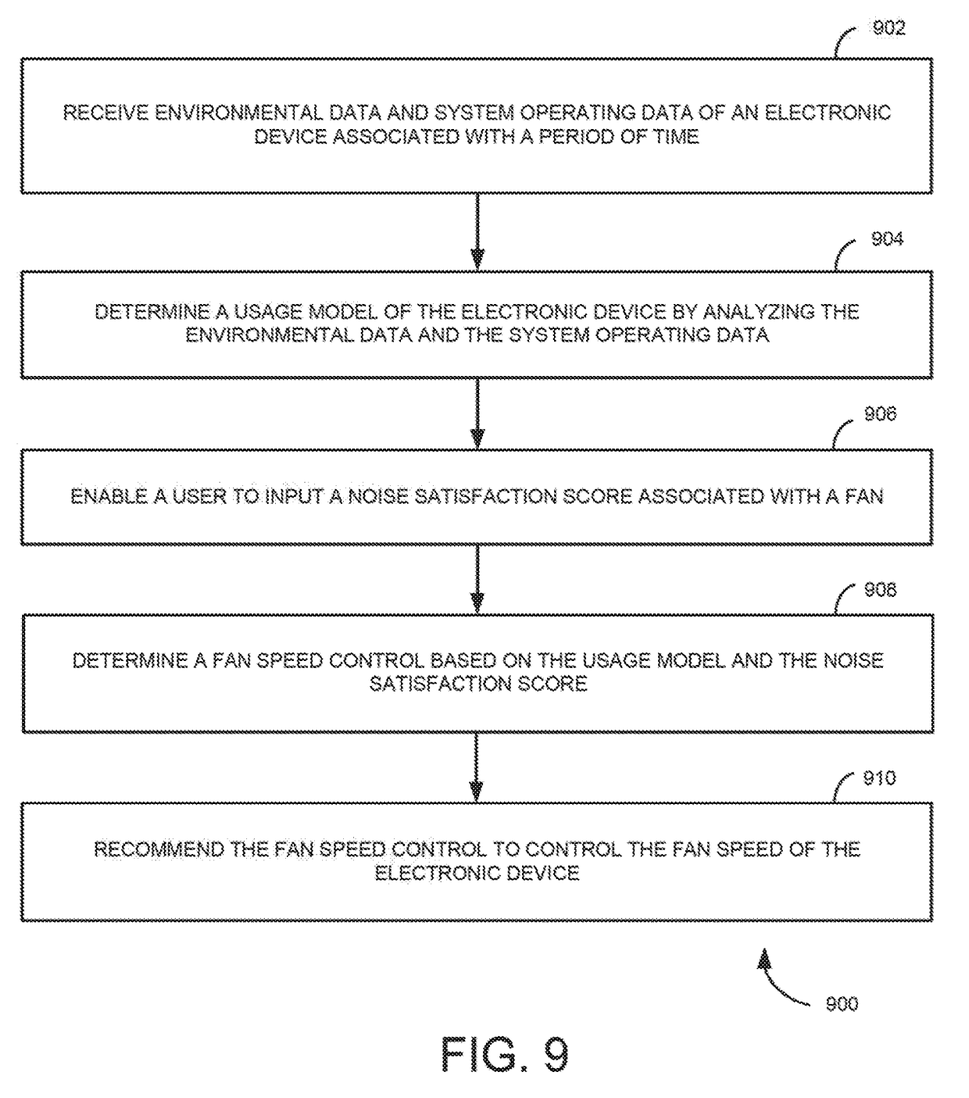
FIG. 9 is an example flow chart of a method for determining a fan speed control based on a usage model and a noise satisfaction score.

FIG. 9 is an example flow chart 900 of a method for determining a fan speed control based on a usage model and a noise satisfaction score. At 902, environmental data and system operating data of an electronic device associated with a period of time may be received. In one example, receiving the environmental data of the electronic device may include obtaining an internal and external environment ambient temperature of the electronic device. In another example, receiving the system operating data may include obtaining activity level of a component in the electronic device, power dissipation of the component, temperature of the component, fan speed, or a combination thereof. The component may be selected from the group consisting of a processor, a graphic card, memory, and a hard disk drive.

At 904, a usage model of the electronic device may be determined by analyzing the environmental data and the system operating data. Example usage model may include a light load, a medium load, a heavy load, or combination thereof. At 906, a user may be enabled to input a noise satisfaction score associated with a fan. In one example, the noise satisfaction score may be selected from a range of values. Each value may be associated with a different noise perception level (e.g., as shown in table 400 of FIG. 4). For example, the user may input the noise satisfaction score via an interface of electronic device At 908, a fan speed control may be determined based on the usage model and the noise satisfaction score. At 910, the fan speed control may be recommended to control the fan speed of the electronic device. Further, the fan speed of the electronic device may be controlled based on the recommended fan speed control, for example, based on user's selection.

In another example, an ambient noise surrounding the electronic device may be detected. Further, speaker volume associated with the electronic device may be detected.

Furthermore, a user may be allowed to select an operating mode of the electronic device. Upon selecting the operating mode of the electronic device, the fan speed control is determined based on the ambient noise and the speaker volume.

Figure 10:
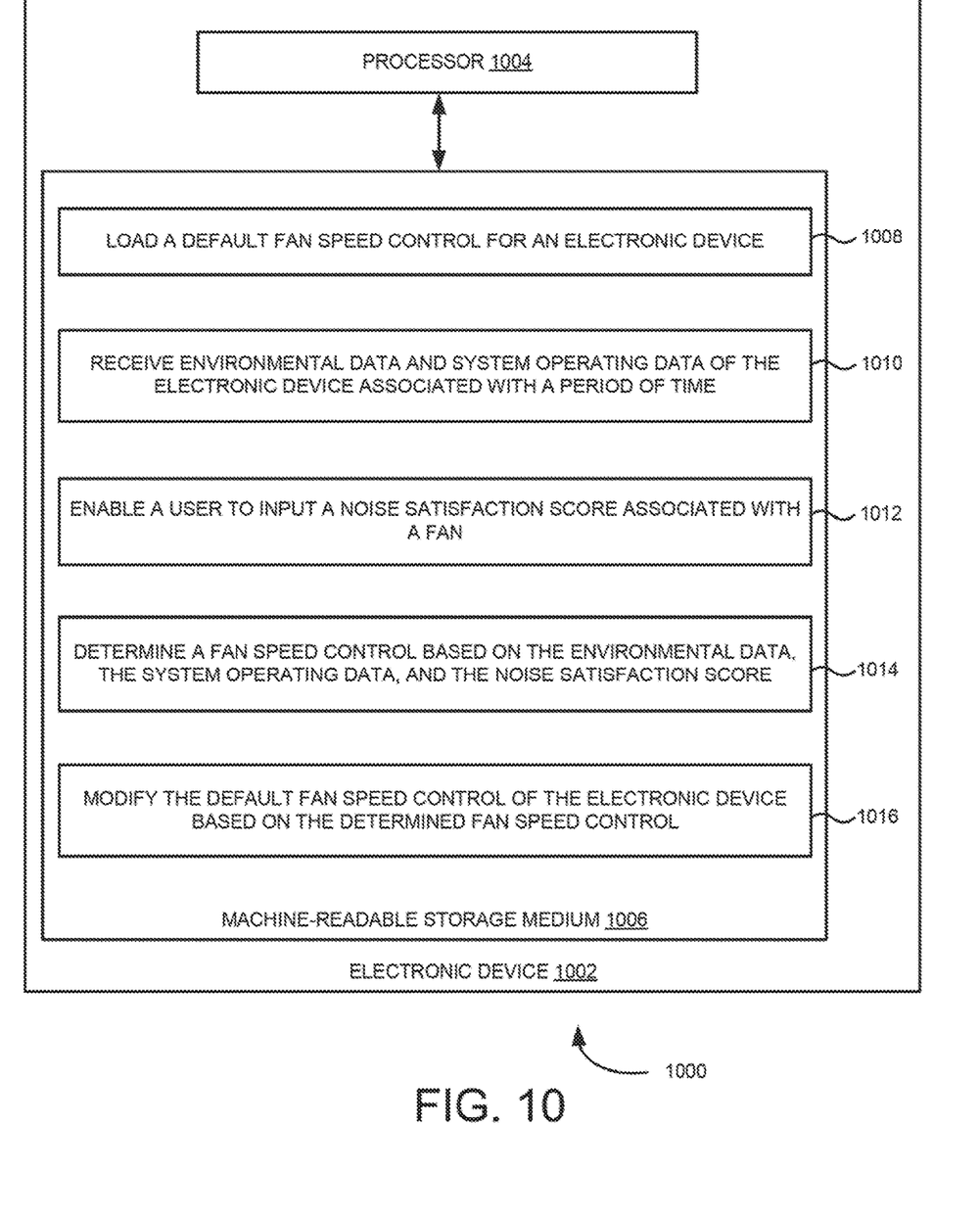
FIG. 10 illustrates a block diagram of an example computing device for modifying a default fan speed in the electronic device based on the environmental data, system operating data and the noise satisfaction score.

FIG. 10 illustrates a block diagram 1000 of an example electronic device 1002 for modifying a default fan speed in electronic device 1002 based on the environmental data, system operating data and the noise satisfaction score. Electronic device 1002 may include a processor 1004 and a machine-readable storage medium 1006 communicatively coupled through a system bus. Processor 1004 may be any type of central processing unit (CPU), microprocessor, or processing logic that interprets and executes machine-readable instructions stored in machine-readable storage medium 1006. Machine-readable storage medium 1006 may be a random access memory (RAM) or another type of dynamic storage device that may store information and machine-readable instructions that may be executed by processor 1004. For example, machine-readable storage medium 1006 may be synchronous DRAM (SDRAM), double data rate (DDR), rambus DRAM (RDRAM), rambus RAM, etc., or storage memory media such as a floppy disk, a hard disk, a CD-ROM, a DVD, a pen drive, and the like. In an example, machine-readable storage medium 1006 may be a non-transitory machine-readable medium. In an example, machine-readable storage medium 1006 may be remote but accessible to electronic device 1002.

Machine-readable storage medium 1006 may store instructions 1008-1016. In an example, instructions 1008-1016 may be executed by processor 1004 to provide a mechanism for modifying a default fan speed in electronic device 1002. Instructions 1008 may be executed by processor 1004 to load a default fan speed control for electronic device 1002. Instructions 1010 may be executed by processor 1004 to receive environmental data and system operating data of electronic device 1002 corresponding to a period of time. Instructions 1012 may be executed by processor 1004 to enable a user to input a noise satisfaction score associated with a fan. Instructions 1014 may be executed by processor 1004 to determine a fan speed control based on the environmental data, the system operating data, and the noise satisfaction score. Instructions 1016 may be executed by processor 1004 to modify the default fan speed control of electronic device 1002 based on the determined fan speed control.

It may be noted that the above-described examples of the present solution is for the purpose of illustration only. Although the solution has been described in conjunction with a specific example thereof, numerous modifications may be possible without materially departing from the teachings and advantages of the subject matter described herein. Other substitutions, modifications and changes may be made without departing from the spirit of the present solution. All of the features disclosed in this specification (including any accompanying claims, abstract and drawings), and/or all of the steps of any method or process so disclosed, may be combined in any combination, except combinations where at least some of such features and/or steps are mutually exclusive.

The terms "include," "have," and variations thereof, as used herein, have the same meaning as the term "comprise" or appropriate variation thereof. Furthermore, the term "based on", as used herein, means "based at least in part on." Thus, a feature that is described as based on some stimulus can be based on the stimulus or a combination of stimuli including the stimulus.

The present description has been shown and described with reference to the foregoing examples. It is understood, however, that other forms, details, and examples can be made without departing from the spirit and scope of the present subject matter that is defined in the following claims.

What is claimed is:

1. An electronic device comprising:
   a speaker;
   a cooling element comprising a fan; and
   a controller coupled to the cooling element, wherein the controller is to:
      detect, prior to activation of the speaker of the electronic device, environmental data of the electronic device, wherein the environmental data comprises environment background noise of the electronic device;
      receive a user input that selects a mode for a speaker volume based control of the cooling element; and
      responsive to the user input selecting the mode for the speaker volume based control of the cooling element:
         detect a speaker volume of the speaker after the activation of the speaker, and
         control a speed of the fan of the cooling element based on the environment background noise and the detected speaker volume.

2. The electronic device of claim 1, further comprising:
   a microphone to detect the environment background noise surrounding the electronic device and detect the speaker volume.

3. The electronic device of claim 1, wherein the controller is to:
   receive a further user input selecting a default cooling element control mode; and
   in response to the further user input:
      receive further environmental data and system operating data of the electronic device associated with a period of time, wherein the further environmental data comprises an internal environment ambient temperature of the electronic device and an external environment ambient temperature of the electronic device, and wherein the system operating data comprises an activity level of a component in the electronic device;
      receive a user input of an acceptable noise level of the cooling element; and
      control the cooling element based on the environmental data, the system operating data, and the acceptable noise level of the cooling element.

4. The electronic device of claim 3, wherein the component is selected from the group consisting of a processor, a graphics card, a memory, and a hard disk drive.

5. The electronic device of claim 3, wherein the controller is to, in response to the further user input:
   determine a usage model of the electronic device by analyzing the further environmental data and the system operating data, the determining of the usage model comprises selecting, based on the analyzing of the further environmental data and the system operating data, a load condition of a plurality of different load conditions corresponding to respective different amounts of computational work of the electronic device; and
   determine, from a plurality of different cooling element controls, a cooling element control based on the usage model and the acceptable noise level,
   wherein the control of the speed of the fan of the cooling element is based on the determined cooling element control.

6. The electronic device of claim 5, wherein the plurality of different cooling element controls correspond to different correlations of fan speeds to temperatures.

7. The electronic device of claim 1, wherein the controller is to:
   select, from a plurality of different speaker volume profiles based on the detected environment background noise, a selected speaker volume profile, wherein the different speaker volume profiles correspond to different levels of environment background noise,
   wherein the control of the speed of the fan of the cooling element is according to the selected speaker volume profile.

8. The electronic device of claim 7, wherein the selected speaker volume profile correlates different speeds of the fan to corresponding different speaker volumes.

9. The electronic device of claim 8, wherein the different speaker volume profiles specify respective different correlations of fan speeds to corresponding different speaker volumes.

10. A method performed by an electronic device, comprising:
    receiving environmental data and system operating data of the electronic device associated with a period of time, wherein the environmental data comprises an internal environment ambient temperature of the electronic device and an external environment ambient temperature of the electronic device, and wherein the system operating data comprises an activity level of a component in the electronic device;
    determining a usage model of the electronic device by analyzing the environmental data and the system operating data, the determining of the usage model comprises selecting, based on the analyzing of the environmental data and the system operating data, a load condition of a plurality of different load conditions corresponding to respective different amounts of computational work of the electronic device;
    receiving a user input of a noise satisfaction score associated with a fan;
    determining, from a plurality of different fan speed controls, a fan speed control based on the usage model and the noise satisfaction score;
    recommending the determined fan speed control to control a speed of the fan of the electronic device; and
    controlling the speed of the fan of the electronic device based on the determined fan speed control.

11. The method of claim 10, wherein the system operating data further comprises a power dissipation of the component.

12. The method of claim 10, wherein the determining of the fan speed control based on the usage model and the noise satisfaction score is performed responsive to user selection of a default fan speed control mode for the electronic device, the method further comprising:
    receiving a further user input that selects a further mode for a speaker volume based control of the fan; and
    in response to the further user input that selects the further mode:
       detecting, prior to activation of a speaker of the electronic device, an ambient noise surrounding the electronic device,
       detecting a speaker volume of the speaker after the activation of the speaker, and controlling the speed of the fan based on the ambient noise and the speaker volume.

13. The method of claim 12, comprising, in response to the user input that selects the further mode:

selecting, by the electronic device from a plurality of different speaker volume profiles based on the ambient noise, a selected speaker volume profile, wherein the different speaker volume profiles correspond to different levels of ambient noise, wherein the controlling of the speed of the fan is according to the selected speaker volume profile.

14. The method of claim 13, wherein the selected speaker volume profile correlates different speeds of the fan to corresponding different speaker volumes.

15. The method of claim 14, wherein the different speaker volume profiles specify respective different correlations of fan speeds to corresponding different speaker volumes.

16. The method of claim 10, wherein the noise satisfaction score is selected from a range of values, wherein each value of the range of values is associated with a different noise perception level.

17. A non-transitory computer-readable storage medium comprising instructions that when executed by an electronic device cause the electronic device to:

detect, prior to activation of a speaker of the electronic device, environment background noise of the electronic device;

receive a user input that selects a mode for a speaker volume based control of a cooling element; and responsive to the user input selecting the mode for the speaker volume based control of the cooling element that comprises a fan:

detect a speaker volume of the speaker after the activation of the speaker, and control a speed of the fan of the cooling element based on the environment background noise and the detected speaker volume.

* * * * *